US012813004B2

(12) United States Patent
Casci et al.

(10) Patent No.: US 12,813,004 B2
(45) Date of Patent: Nov. 24, 2026

(54) POWER DEVICE PHOTONIC TEMPERATURE SENSING

(71) Applicant: FORD GLOBAL TECHNOLOGIES, LLC, Dearborn, MI (US)

(72) Inventors: John P. Casci, Pontiac, MI (US); Baoming Ge, Okemos, MI (US); Fan Wang, Novi, MI (US)

(73) Assignee: FORD GLOBAL TECHNOLOGIES, LLC, Dearborn, MI (US)

( * ) Notice: Subject to any disclaimer, the term of this patent is extended or adjusted under 35 U.S.C. 154(b) by 259 days.

(21) Appl. No.: 18/816,216

(22) Filed: Aug. 27, 2024

(65) Prior Publication Data

US 2026/0068349 A1 Mar. 5, 2026

(51) Int. Cl.

*H10F 55/20* (2025.01)
*H10D 62/832* (2025.01)
*H10W 90/00* (2026.01)

(52) U.S. Cl.

CPC ............ *H10F 55/20* (2025.01); *H10W 90/00* (2026.01); *H10D 62/8325* (2025.01); *H10W 90/734* (2026.01)

(58) Field of Classification Search

CPC ... H10D 62/8325; H10F 55/20; H10W 90/00; H10W 90/734

See application file for complete search history.

(56) References Cited

U.S. PATENT DOCUMENTS

| | | | | |
|---|---|---|---|---|
| 11,422,101 | B2 | 8/2022 | Herman et al. | |
| 12,677,699 | B2 * | 7/2026 | Sharma | H10W 90/00 |
| 2006/0067605 | A1 * | 3/2006 | Mirkarimi | G02B 6/1225 385/12 |
| 2008/0192803 | A1 * | 8/2008 | Riza | G01K 11/125 374/161 |
| 2009/0296776 | A1 * | 12/2009 | Riza | G01L 11/02 374/130 |
| 2022/0413215 | A1 * | 12/2022 | Lin | G02B 6/12019 |
| 2023/0152164 | A1 | 5/2023 | Gu et al. | |

FOREIGN PATENT DOCUMENTS

| | | | |
|---|---|---|---|
| CN | 107957299 | B | 12/2019 |
| JP | 6126949 | B2 | 5/2017 |

OTHER PUBLICATIONS

Powell K, et al. "Integrated silicon carbide electro-optic modulator." Nat Commun. 2022;13(1):1851. Published Apr. 5, 2022. (Year: 2022).*

Purdy et al., "Observation of Optomechanical Quantum Correlations at Room Temperature", arXiv:1605.05664v1 [quant-ph], May 18, 2016, 13 pages.

* cited by examiner

*Primary Examiner* — Mark R Gaworecki

(74) *Attorney, Agent, or Firm* — David B. Kelley; Brooks Kushman P.C.

(57) ABSTRACT

A power device sensor includes a semiconductor thermo-optic element, circuitry including a light-emitting diode that emits photons and a photodetector that detects the photons and alters a voltage output by the circuitry, and an optical waveguide in optical communication with the light-emitting diode, the semiconductor thermo-optic element, and the photodetector.

19 Claims, 2 Drawing Sheets

POWER DEVICE PHOTONIC TEMPERATURE SENSING

TECHNICAL FIELD

This disclosure relates to power electronics and semiconductor materials.

BACKGROUND

Semiconductors are materials that have electrical conductivity between that of conductors (like metals) and insulators (like ceramics). This intermediate conductivity can be controlled by adding impurities, a process known as doping. Silicon has been the dominant semiconductor material due to its abundance, well-established manufacturing processes, and favorable electronic properties. However, as the demand for more efficient, higher power, and high-temperature electronic devices has grown, the limitations of silicon have become more apparent.

Silicon Carbide (SiC) is a compound semiconductor composed of silicon and carbon atoms. It is known for its wide bandgap, which is the energy difference between the valence band and the conduction band of the material. A wide bandgap allows SiC devices to operate at higher voltages, temperatures, and frequencies compared to silicon devices. Additionally, SiC has a high thermal conductivity, which means it can efficiently dissipate heat generated during operation.

SUMMARY

A SiC power device comprises a substrate, a SiC die mounted on the substrate, and a source positioned on the SiC die. It also includes a semiconductor thermo-optic element in direct contact with the source, a sensor with a light-emitting diode (LED) and a photodetector, and an optical waveguide. The optical waveguide is configured to establish optical communication between the semiconductor thermo-optic element, the LED, and the photodetector. Photons emitted by the LED and reflected by the semiconductor thermo-optic element are directed to the photodetector, thereby influencing the voltage output of the sensor.

A switch arrangement has a SiC power device, a semiconductor thermo-optic element in direct contact with the power device, a sensor, and an optical waveguide. The optical waveguide facilitates optical communication between the semiconductor thermo-optic element and the sensor.

A power device sensor includes a semiconductor thermo-optic element designed to be placed in contact with a SiC power device. It also comprises circuitry with a LED for emitting photons and a photodetector for detecting the photons and modifying the voltage output of the circuitry. An optical waveguide is integrated to establish optical communication between the LED, the semiconductor thermo-optic element, and the photodetector.

DETAILED DESCRIPTION

Figure 1:
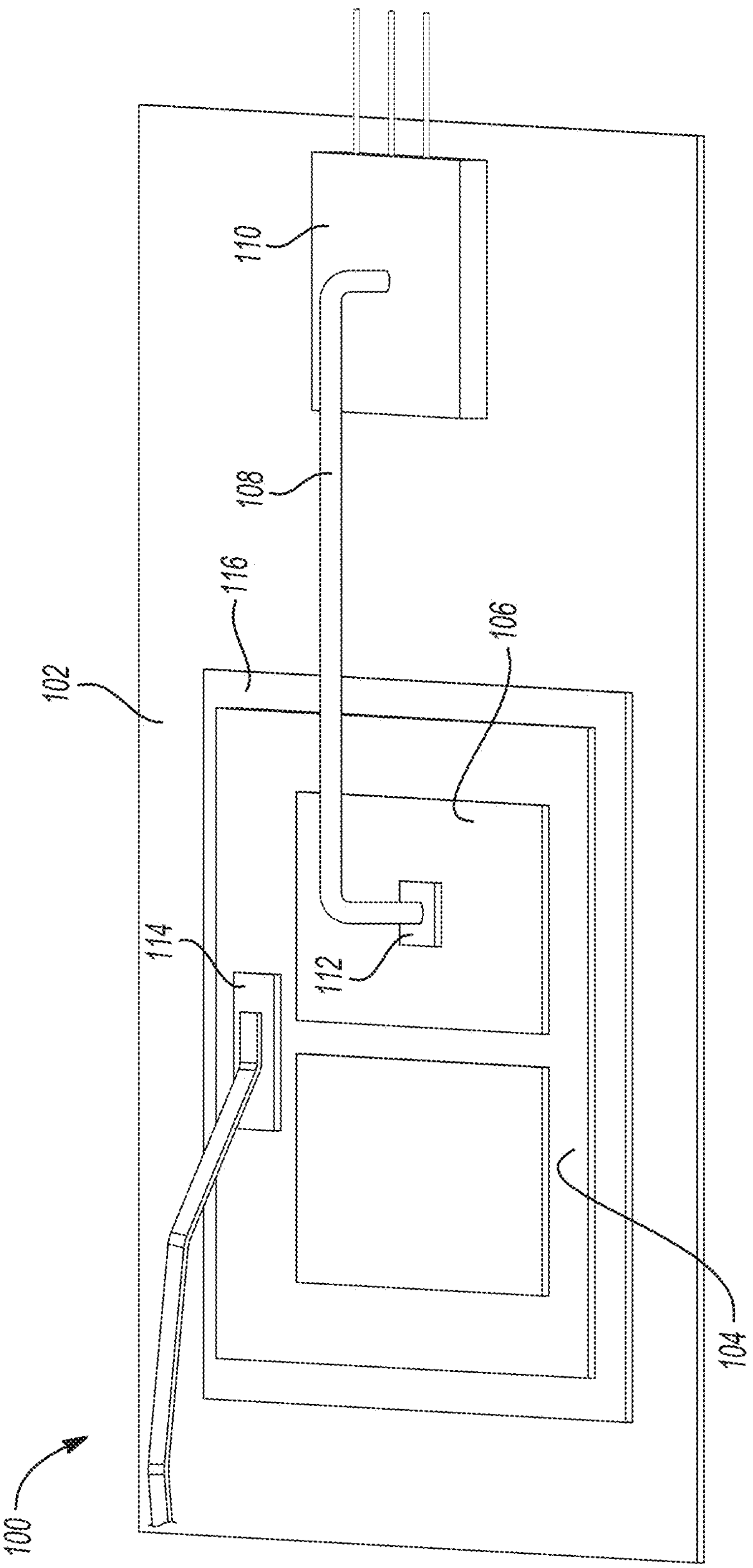
FIG. 1 is a schematic diagram of a power device and sensor.

Embodiments are described herein. It should be understood, however, that these embodiments are merely examples, and other embodiments may take various alternative forms. The figures provided are not necessarily to scale, and some features may be exaggerated or minimized to highlight particular components. Therefore, the specific structural and functional details disclosed are not to be interpreted as limiting but rather as a representative basis for teaching those skilled in the art.

The combinations of features shown provide representative embodiments for typical applications. However, various combinations and modifications of these features, consistent with the teachings of this disclosure, may be desired for particular applications or implementations.

SiC power devices have affected power electronics development with their material properties, making them well-suited for high-power and high-temperature applications. The wide bandgap of SiC, measuring 3.26 eV compared to silicon's 1.12 eV, enables these devices to operate at higher voltages, temperatures, and frequencies. This wide bandgap results in a higher breakdown voltage, allowing SiC devices to withstand greater electric fields and thus operate at elevated voltages without breaking down.

A possible advantage of SiC power devices is their high thermal conductivity, about three times higher than that of silicon. This characteristic facilitates more efficient heat dissipation, reducing the need for extensive cooling systems and enhancing overall system efficiency. The ability to function at higher temperatures, often exceeding 200° C., extends their usability in harsh environments and high-power density applications. Additionally, SiC devices benefit from higher electron mobility and lower on-resistance, enabling faster switching speeds. These properties lead to reduced switching losses and allow for higher frequency operation, which enables the design of compact and efficient power converters.

SiC power devices include various components such as SiC Metal-Oxide-Semiconductor Field-Effect Transistors (MOSFETs), SiC Schottky diodes, and SiC Junction Field-Effect Transistors (JFETs). Each of these components is constructed with specific design considerations to leverage the unique properties of SiC.

SiC MOSFETs are constructed with a gate oxide layer, typically silicon dioxide, on top of the SiC substrate. The source and drain regions are heavily doped to form ohmic contacts, while the channel region is lightly doped to control the current flow. The gate structure controls the channel conductivity, allowing the device to switch on and off rapidly. The thin gate oxide layer and the SiC substrate facilitate high-voltage operation and fast switching.

SiC Schottky diodes are constructed with a metal-semiconductor junction instead of a traditional p-n junction. This structure allows for lower forward voltage drop and faster recovery times, reducing switching losses. The Schottky barrier height can be tailored by selecting appropriate metals, optimizing the device's performance for specific applications.

SiC JFETs are typically constructed with a vertical structure, where the current flows from the source to the drain through a channel controlled by the gate voltage. The vertical design minimizes on-resistance and maximizes current handling capabilities. The gate region is doped to create a junction that controls the channel's conductivity, allowing modulation of the current flow.

SiC power devices are used in electric vehicles. Inverters and onboard chargers benefit from the high-frequency operation and reduced thermal management requirements of SiC devices. Renewable energy systems, such as solar inverters and wind turbine converters, utilize the high efficiency and reliability of SiC devices to maximize energy conversion and minimize system losses. Industrial applications, including motor drives and power supplies, benefit from the robustness and high-temperature operation of SiC devices.

Accurately measuring the junction temperature of SiC devices remains a significant challenge. The lack of integrated on-die temperature sensors in most available products complicate direct junction temperature measurement. Some existing methods rely on indirect temperature measurements or algorithmic estimations, which can compromise accuracy, especially during dynamic events.

The inability to accurately measure junction temperature sometimes hinders the efficient utilization of SiC power devices. Inaccurate temperature readings can affect power derating control and the optimization of chip size. Furthermore, imprecise temperature measurements can affect the device's lifetime. Accurate junction temperature measurement can play a role in maximizing the performance and reliability of SiC power devices in electric vehicle applications. Arrangements are thus described to directly measure SiC device junction temperature.

The thermo-optic effect is a phenomenon where the refractive index of a material changes in response to variations in temperature. This effect is particularly significant in optical materials and devices where precise control over light propagation is necessary. The refractive index, a fundamental property of materials, determines how light travels through a medium. It is defined as the ratio of the speed of light in a vacuum to the speed of light in the material. As temperature changes, the atomic or molecular structure of a material can expand or contract, leading to changes in the density and the electronic polarizability of the material. These changes directly affect the refractive index.

In silicon and certain other materials, the thermo-optic effect is pronounced. Silicon has a relatively high thermo-optic coefficient, meaning its refractive index changes significantly with temperature.

The relationship between temperature and the refractive index of silicon is governed by the material's thermo-optic coefficient. For silicon, this coefficient is positive, indicating that the refractive index increases with rising temperature. The magnitude of this change is influenced by factors such as the wavelength of light and the specific characteristics of the silicon used, including its doping amount and crystalline structure.

In practical applications, the thermo-optic effect in silicon and other materials can be exploited for temperature sensing. When integrated into a device, changes in temperature alter the refractive index of silicon components. These changes can be detected by monitoring variations in the propagation characteristics of light, such as shifts in resonance frequencies or changes in light intensity.

A mechanical element made from silicon, gallium nitride, etc. is bonded to a SiC die using microfabrication techniques, such as wafer bonding or silicon fusion bonding. As the temperature of the die changes, the silicon mechanical element also changes temperature correspondingly due to its direct thermal contact. This semiconductor thermo-optic element is positioned within a cavity-enhanced optical probe, such as a fiber-optic conduit, designed to guide light with minimal loss.

The thermo-optic effect in the silicon mechanical element results in a linear change in its refractive index as the temperature varies. Photons emitted by a LED, quantum cascade laser, etc. in the sensor travel through the optical cavity, reflect off the surface of the mechanical element, and return to the photodetector within the sensor. The LED may operate at a specific wavelength suited for high sensitivity to refractive index changes, such as in the near-infrared range.

The photodetector converts these returning photons into a voltage signal using, for example, a photodiode or avalanche photodiode for higher sensitivity. This voltage signal is then communicated to a processor, which uses calibration data to correlate the voltage signal with the temperature of the SiC die. This method allows the optical probe to detect the SiC die's temperature with a high degree of accuracy.

This technique enables the direct measurement of the hottest spot or multiple locations on the SiC chip with high spatial resolution and reliability. By mapping temperature variations across the chip, it provides data for thermal management and performance optimization.

A cavity-enhanced optical probe transmits photons with precision and reliability. It can be constructed from nanoscale reflective fiber or a prism, often made from materials like silica or sapphire for their optical clarity and durability. Its compact size and structure, often less than a few millimeters in diameter, allow it to be positioned anywhere on the SiC device or across multiple locations if needed. The conduit features a robust mechanical structure, possibly encased in protective cladding, and its use of photonic resonance and intensity measurement, rather than current and voltage like typical resistance thermometers, renders it nearly immune to electromagnetic interference (EMI) from nearby electronic devices. This is particularly useful in high-power environments where EMI can be significant.

The photonic sensor, a photonics-based quantum silicon device in some examples, is sensitive to photonic energy. It utilizes the principles of photonic thermometry to analyze the unique spectral characteristics of the mechanical element bonded to the SiC chip. By sensing the intensity of photons reflected off the mechanical element and carried through the probe, the sensor outputs an electrical signal that linearly corresponds to the junction temperature measurement. This signal is then relayed to a central control board, where it can be used for real-time thermal management.

FIG. 1 illustrates a SiC power device arrangement 100. The arrangement 100 includes a substrate 102, a SiC die 104, a source 106, an optical waveguide 108, a sensing arrangement 110, a silicon blank 112, a gate 114, and solder 116. The SiC die 104 is attached to the substrate 102 using solder 116. Positioned on top of the source 106, the silicon blank 112 is optically connected to the sensing arrangement 110 through the optical waveguide 108.

Figure 2:
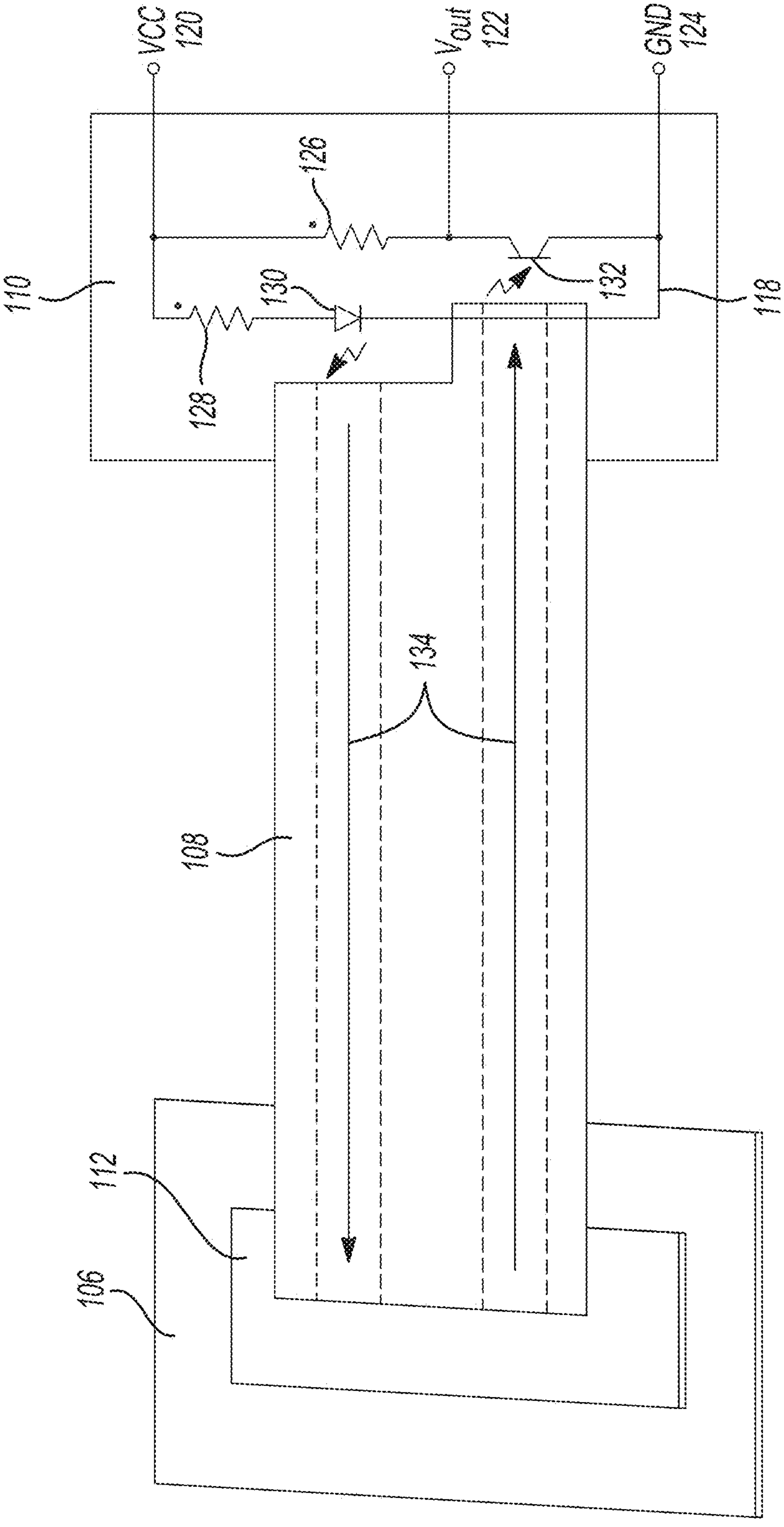
FIG. 2 is a schematic diagram of portions of the power device and sensor of FIG. 1.

FIG. 2 provides additional details of the sensing arrangement 110 and the optical waveguide 108. The sensing arrangement 110 comprises a circuit 118, which includes a supply voltage 120, an output voltage 122, a ground 124, a first resistor 126, a second resistor 128, a LED 130, and a photodetector 132. The LED 130 emits photons 134, which are transmitted through the optical waveguide 108 to the silicon blank 112. The silicon blank 112 reflects the photons 134, and these reflected photons travel back through the optical waveguide 108 towards the sensing arrangement 110, where they are detected by the photodetector 132. The photodetector 132 then produces an electrical signal corresponding to the intensity of the reflected photons 134, resulting in a corresponding change in the output voltage 122. This output voltage 122 is used to determine the temperature of the source 106 at the location of the silicon blank 112.

As the source 106 heats up, the silicon blank 112 also undergoes a temperature change due to heat transfer. The temperature change in the silicon blank 112 causes a change in its refractive index due to the thermo-optic effect. A higher refractive index results in more light being reflected by the silicon blank 112 and less light being transmitted into it. Consequently, the intensity of the reflected photons 134 increases when the refractive index of the silicon blank 112 is higher.

When current flows through the LED 130, electrons recombine with electron holes, emitting photons 134. The intensity of the emitted photons 134 is directly related to the current flowing through the LED 130.

The photodetector 132 can be of any type, such as a phototransistor or a photodiode. Phototransistors generate and amplify a current when struck by a photon, with the current proportional to the light intensity. Since the intensity of the reflected photons 134 correlates with the temperature of the source 106 at the location of the silicon blank 112, the current generated by the photodetector 132 in response to the photons 134 also correlates with the chip's temperature. The change in current due to the photodetector's response to the photons 134 will affect the output voltage 122 of the circuit 118. Therefore, the output voltage 122 can be used to accurately determine the temperature of the source 106 at the location of the silicon blank 112.

While exemplary embodiments are described above, these embodiments are not intended to encompass all possible forms covered by the claims. The language used in the specification is descriptive rather than limiting, and it is understood that various modifications can be made without departing from the spirit and scope of the disclosure.

As previously described, features of various embodiments can be combined to create further embodiments of the invention that may not be explicitly described or illustrated. Although certain embodiments may be described as offering advantages or being preferred over other embodiments or prior art implementations with respect to specific characteristics, those skilled in the art will recognize that certain features or characteristics may be adjusted to achieve the desired overall system attributes, depending on the specific application and implementation. These attributes can include, but are not limited to, strength, durability, marketability, appearance, packaging, size, serviceability, weight, manufacturability, and ease of assembly. Consequently, embodiments that may be considered less desirable in terms of one or more characteristics are not outside the scope of the disclosure and may be suitable for particular applications.

What is claimed is:

1. A silicon carbide power device comprising:

a substrate;

a silicon carbide die on the substrate;

a source on the silicon carbide die;

a semiconductor thermo-optic element in direct contact with the source;

a sensor including a light-emitting diode and a photodetector; and an optical waveguide in optical communication with the semiconductor thermo-optic element, photodiode, and photodetector such that photons emitted by the photodiode and reflected by the semiconductor thermo-optic element impinge on the photodetector and affect a voltage output by the sensor.

2. The silicon carbide power device of claim 1, wherein the semiconductor thermo-optic element is a silicon blank.

3. The silicon carbide power device of claim 1, wherein the optical waveguide is a fiber.

4. The silicon carbide power device of claim 1, wherein the optical waveguide is a prism.

5. The silicon carbide power device of claim 1, wherein the photodetector is phototransistor.

6. The silicon carbide power device of claim 1, wherein the photodetector is a photodiode.

7. A switch arrangement comprising:

a silicon carbide power device;

a semiconductor thermo-optic element in direct contact with the silicon carbide power device;

a sensor; and an optical waveguide in optical communication with the semiconductor thermo-optic element and sensor.

8. The switch arrangement of claim 7, wherein the silicon carbide power device includes a source, and the semiconductor thermo-optic element is in direct contact with the source.

9. The switch arrangement of claim 7, wherein the sensor includes a light-emitting diode configured to emit photons and a photodetector configured to detect the photons.

10. The switch arrangement of claim 9, wherein the optical waveguide is configured to guide the photons.

11. The switch arrangement of claim 9, wherein the photodetector is arranged to affect a voltage output by the sensor.

12. The switch arrangement of claim 9, wherein the photodetector is a phototransistor or a photodiode.

13. The switch arrangement of claim 7, wherein the optical waveguide is a fiber or a prism.

14. A power device sensor comprising:

a semiconductor thermo-optic element configured to be placed in contact with a silicon carbide power device;

circuitry including a light-emitting diode configured to emit photons, and a photodetector configured to detect the photons and alter a voltage output by the circuitry; and an optical waveguide in optical communication with the light-emitting diode, semiconductor thermo-optic element, and photodetector.

15. The power device sensor of claim 14, wherein the semiconductor thermo-optic element is a silicon blank.

16. The power device sensor of claim 14, wherein the optical waveguide is a fiber.

17. The power device sensor of claim 14, wherein the optical waveguide is a prism.

18. The power device sensor of claim 14, wherein the photodetector is phototransistor.

19. The power device sensor of claim 14, wherein the photodetector is a photodiode.

* * * * *